United States Patent
Esteron et al.

(10) Patent No.: US 11,881,434 B2
(45) Date of Patent: *Jan. 23, 2024

(54) SEMICONDUCTOR DIE SINGULATION (71) Applicant: Texas Instruments Incorporated, Dallas, TX (US)

(72) Inventors: Connie Alagadan Esteron, Laoac Pangasinan (PH); Dolores Babaran Milo, Baguio (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 249 days.

This patent is subject to a terminal disclaimer.

(21) Appl. No.: 17/242,141

(22) Filed: Apr. 27, 2021

(65) Prior Publication Data

US 2021/0249306 A1 Aug. 12, 2021

Related U.S. Application Data

(63) Continuation of application No. 16/532,058, filed on Aug. 5, 2019, now Pat. No. 10,991,621.

(51) Int. Cl.
  *H01L 21/78* (2006.01)
  *H01L 21/683* (2006.01)
  (Continued)

(52) U.S. Cl.
  CPC ............ *H01L 21/78* (2013.01); *H01L 21/561* (2013.01); *H01L 21/6836* (2013.01);
  (Continued)

(58) Field of Classification Search
  CPC ... H01L 21/78; H01L 21/561; H01L 21/6836; H01L 24/32; H01L 24/49; H01L 24/73;
  (Continued)

(56) References Cited

U.S. PATENT DOCUMENTS 4,687,693 A 8/1987 Sheyon et al.
7,456,104 B2 * 11/2008 Kusumoto .......... H01L 27/1266
  438/149
(Continued)

OTHER PUBLICATIONS

"Conductive Die Attach Film—Henkel's Solution to Control Flow," Brochure, Henkel Corporation, Apr. 25, 2017, accessed Aug. 2, 2019, dm.henkel-dam.com/is/content/henkel/12016_LT_6901_CDAF_BrochureUpdate_A4_4-25-17_Folder_12016_LT_6901_CDAF_BrochureUpdate_A4_4-25-17_HRpdf.

*Primary Examiner* — Vu A Vu
(74) *Attorney, Agent, or Firm* — Dawn Jos; Frank D. Cimino (57) ABSTRACT

In a described example, a method includes: forming a metal layer on a backside surface of a semiconductor wafer, the semiconductor wafer having semiconductor dies spaced apart by scribe lanes on an active surface of the semiconductor wafer opposite the backside surface; forming a layer with a modulus greater than about 4000 MPa up to about 8000 MPa over the metal layer; mounting the backside of the semiconductor wafer on a first side of a dicing tape having an adhesive; cutting through the semiconductor wafer, the metal layer, and the layer with a modulus greater than about 4000 MPa up to about 8000 MPa along scribe lanes; separating the semiconductor dies from the semiconductor wafer and from one another by stretching the dicing tape, expanding the cuts in the semiconductor wafer along the scribe lanes between the semiconductor dies; and removing the separated semiconductor dies from the dicing tape.

20 Claims, 6 Drawing Sheets

(51) Int. Cl.
*H01L 23/00* (2006.01)
*H01L 21/56* (2006.01)

(52) U.S. Cl.
CPC .............. *H01L 24/32* (2013.01); *H01L 24/49* (2013.01); *H01L 24/73* (2013.01); *H01L 24/83* (2013.01); *H01L 24/95* (2013.01); *H01L 2221/68336* (2013.01); *H01L 2224/73265* (2013.01)

(58) Field of Classification Search
CPC ..................... H01L 24/83; H01L 24/95; H01L 2221/68336; H01L 2224/73265; H01L 24/06; H01L 24/13; H01L 24/16; H01L 24/29; H01L 24/48; H01L 24/81; H01L 2224/03848; H01L 2224/04026; H01L 2224/04042; H01L 2224/05111; H01L 2224/05139; H01L 2224/05144; H01L 2224/05155; H01L 2224/05164; H01L 2224/05169; H01L 2224/05567; H01L 2224/0579; H01L 2224/058; H01L 2224/0603; H01L 2224/06181; H01L 2224/45099; H01L 2224/48091; H01L 2224/48464; H01L 2224/834; H01L 2224/83411; H01L 2224/83447; H01L 2224/83455; H01L 2224/8346; H01L 2224/83464; H01L 2224/854; H01L 2224/85411; H01L 2224/85447; H01L 2224/85455; H01L 2224/8546; H01L 2224/85464; H01L 24/03; H01L 24/05; H01L 24/94; H01L 2224/03003; H01L 2224/03436; H01L 2224/0345; H01L 2224/03462; H01L 2224/03464; H01L 2224/039; H01L 2224/16245; H01L 2224/2919; H01L 2224/2929; H01L 2224/293; H01L 2224/32245; H01L 2224/48247; H01L 2224/81815; H01L 2224/94; H01L 23/3157; H01L 23/482; H01L 2221/68322
USPC ........................................................ 257/784
See application file for complete search history.

(56) References Cited

U.S. PATENT DOCUMENTS

| | | | | |
|---|---|---|---|---|
| 7,875,500 | B2* | 1/2011 | Inada | H01L 24/27 438/464 |
| 8,309,219 | B2* | 11/2012 | Hwang | C09J 7/20 438/464 |
| 8,435,837 | B2* | 5/2013 | Tsai | H01L 24/97 438/119 |
| 8,436,479 | B2* | 5/2013 | Sasaki | H01L 31/02008 257/702 |
| 8,728,910 | B2* | 5/2014 | Hayashishita | B32B 27/08 438/455 |
| 8,810,015 | B2* | 8/2014 | Camacho | H01L 24/49 257/676 |
| 8,963,622 | B2* | 2/2015 | Lee | H02M 3/33523 327/530 |
| 8,987,057 | B2* | 3/2015 | Van Gemert | H01L 21/561 438/111 |
| 8,993,412 | B1* | 3/2015 | Iriguchi | H01L 24/32 438/464 |
| 9,754,983 | B1* | 9/2017 | Su | H01L 21/4803 |
| 9,768,050 | B2 | 9/2017 | Takamoto et al. | |
| 10,079,198 | B1* | 9/2018 | Cadag | H01L 23/3192 |
| 10,991,621 | B2* | 4/2021 | Esteron | H01L 23/3157 |
| 2016/0071819 | A1 | 3/2016 | Fuergut et al. | |
| 2020/0051860 | A1 | 2/2020 | Wyant et al. | |

* cited by examiner

FIG. 9

SEMICONDUCTOR DIE SINGULATION

This application is a continuation of patent application Ser. No. 16/532,058, filed Aug. 5, 2019, the contents of all of which are herein incorporated by reference in its entirety.

TECHNICAL FIELD

This disclosure relates generally to semiconductor dies, and more particularly to a method of semiconductor die singulation for semiconductor dies with a metal layer over a backside surface.

SUMMARY

In a described example, a method includes forming a metal layer on a backside surface of a semiconductor wafer. The semiconductor wafer has semiconductor dies spaced apart by scribe lanes on an active surface of the semiconductor wafer opposite the backside surface; forming a layer with a modulus greater than about 4000 MPa and up to about 8000 MPa over the metal layer; mounting the backside of the semiconductor wafer including the metal layer and the layer with a modulus greater than about 4000 MPa and up to about 8000 MPa on a first side of a dicing tape having an adhesive. The method continues by cutting through the semiconductor wafer, the metal layer, and the layer with a modulus greater than about 4000 MPa and up to about 8000 MPa along scribe lanes. The semiconductor dies are separated from the semiconductor wafer and from one another by stretching the dicing tape, expanding the cuts in the semiconductor wafer along the scribe lanes between the semiconductor dies; and removing the separated semiconductor dies from the dicing tape.

DETAILED DESCRIPTION

Corresponding numerals and symbols in the different figures generally refer to corresponding parts, unless otherwise indicated. The figures are not necessarily drawn to scale.

The term "scribe lane" is used herein. A scribe lane is a portion of semiconductor wafer between semiconductor dies. Sometimes in related literature the term "scribe street" is used. Once processing is finished and the semiconductor devices are complete, the semiconductor devices are separated into individual semiconductor dies by severing the semiconductor wafer along the scribe lanes. The separated dies can then be removed and handled individually for further processing including packaging. This process of removing dies from a wafer is referred to as "singulation" or sometimes referred to as "dicing." Scribe lanes are arranged on four sides of semiconductor dies and when the dies are singulated from one another, rectangular semiconductor dies are formed. A semiconductor die that is separated from a wafer by singulation can be described as a "singulated" semiconductor die.

Elements are described herein as "coupled." As used herein, the term "coupled" includes elements that are directly connected, and elements that are electrically connected even with intervening elements or wires are also coupled. Elements are also coupled when connected using optical coupling where light is transmitted between elements.

The term "semiconductor die" is used herein. A semiconductor die can be a discrete semiconductor device such as a bipolar transistor, a few discrete devices such as a pair of power FET switches fabricated together on a single semiconductor die, or a semiconductor die can be an integrated circuit with multiple semiconductor devices such as the multiple capacitors in an A/D converter. The semiconductor die can include passive devices such as resistors, inductors, filters, or active devices such as transistors. The semiconductor die can be an integrated circuit with hundreds or thousands of transistors coupled to form a functional circuit, for example a microprocessor or memory device. The semiconductor die can be a passive device such as a sensor, example sensors include photocells, transducers, and charge coupled devices (CCDs), or can be a micromechanical device, such as a digital micromirror device (DMD) or a micro-electromechanical system (MEMS) device.

The term "thick metal layer" is used herein. As used herein, a thick metal layer is a layer that has a total thickness of greater than about 2 microns, or 2 μms. In the arrangements, a thick metal layer is formed on a backside surface of a semiconductor wafer that has semiconductor devices formed on an opposite active surface. The thick backside metal layer can be of various thicknesses greater than about 2 μms. In addition, the thick backside metal layer can be of various metals and can include multiple metal layers. In one example arrangement described herein, a thick backside metal layer includes a layer of titanium that is about 0.2 μms over a backside surface of a semiconductor wafer, a layer of nickel of about 0.2 μms over the layer of titanium, and a final layer of silver or a silver alloy that is about 3 μms thick over the nickel layer. Additional plating layers can be formed over the silver layer to form further arrangements.

The term "high modulus layer" is used herein. As used herein, a high modulus layer is a layer of material having an elastic modulus greater than about 4000 MegaPascals (MPa) and up to about 8000 MPa, measured at 25 degrees Celsius. In a particular example arrangement further described hereinbelow, a high modulus layer is formed using a film with a modulus of about 5400 MPa. Other high modulus layers can be formed of materials with varying modulus that can be used in the arrangements, so long as the modulus is greater than about 4000 MPa and up to about 8000 MPa. In addition to using films, in alternative arrangements the high modulus layers can be formed by ink jet deposition including ink jet deposition of multiple thin layers to form a thicker layer, stencil printing and screen printing.

In the arrangements, the problem of burrs that occur when sawing through a backside metal layer material during singulation of a semiconductor wafer is solved by depositing a layer of high modulus material over the backside metal layer prior to wafer sawing. The high modulus material supports the backside metal during the sawing operations, preventing metal burrs from forming on the semiconductor devices during wafer sawing, and thereby reducing or eliminating defects that can be caused by metal burrs extending from the singulated semiconductor dies during subsequent packaging steps. Yield of the finished packaged semiconductor devices is increased, lowering costs. Surprisingly, even though an electrical isolation is desired in a packaged device between the die and a substrate, in example arrangements a conductive die attach film is advantageously used to provide the high modulus material, the high modulus material having a modulus greater than about 4000 MPa and up to about 8000 MPa at 25 degrees Celsius.

FIGS. 1A through 1G are cross sectional views of the major manufacturing steps for singulating semiconductor dies from a semiconductor wafer.

Figure 1A:
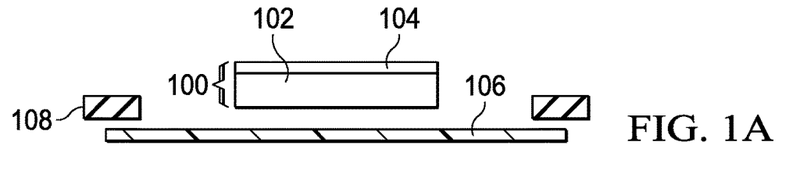
FIGS. 1A-1G are cross sectional views of the major steps for singulating semiconductor dies using sawing.

FIG. 1A shows a semiconductor wafer 100 positioned over a dicing tape 106. Semiconductor devices 104 such as a resistors, capacitors, transistors, analog circuits, or integrated circuits are built on and in the active surface of the substrate 102 of the semiconductor wafer 100. The semiconductor devices are separated from one another by scribe lanes (not shown in FIG. 1A) that run between the semiconductor devices. The scribe lanes are in two sets arranged in two directions, parallel to corresponding scribe lanes in the same direction in the same set, and the two sets of scribe lanes intersect one another to surround each of the semiconductor devices 104 on four sides.

Figure 1B:
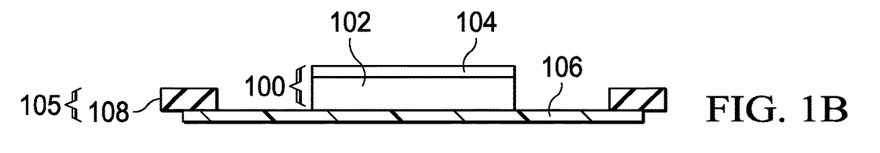

FIG. 1B illustrates in a cross sectional view the wafer 100 placed on the dicing tape 106 which is held in place by a frame 108 that surrounds the wafer 100, the frame and the dicing tape forming a dicing assembly 105.

In FIG. 1B a sticky side of a dicing tape 106 is adhered to the bottom surface (as oriented in FIG. 1B) of a flexible dicing frame 108. The semiconductor wafer 100 is positioned in the center of the dicing ring 108 and has its backside surface (opposite the active surface) adhered to the sticky side of the dicing tape 106, forming a wafer dicing assembly 105. The flexible dicing frame 108 supports the dicing tape 106 and the semiconductor wafer 100. As described further hereinbelow, a dicing tool will operate to extend cuts made into through semiconductor substrate 102 along the scribe lanes between the semiconductor dies 103 (see FIG. 1F). The frame 108 also supports the wafer dicing assembly 105 in a sawing tool and in the dicing tool.

Figure 1C:
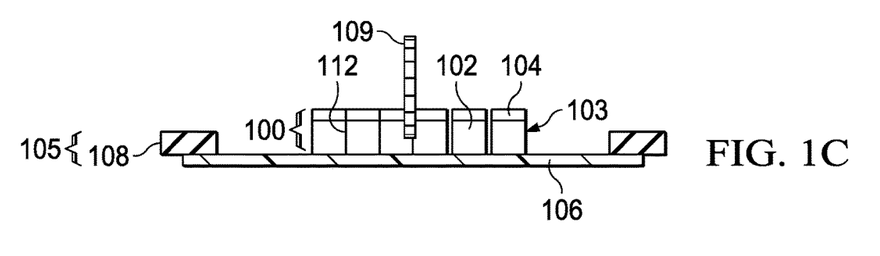

As shown in FIG. 1C, in a wafer sawing tool, a rotating blade 109 is used to cut into the wafer 100, starting from an active surface side of the wafer and moving through the substrate 102 along the scribe lanes 112 between the semiconductor dies 103. In an example, the saw blade 109 has a first saw blade that is thinner and larger in diameter than a second saw blade, the first saw blade extending to a depth 100% of the wafer thickness, the second saw blade extending to a shallower depth such as 70% of the wafer thickness, to form cuts along the scribe lanes 112. In another example, the blade 109 can be of a single width as shown in FIG. 1C.

Figure 1D:
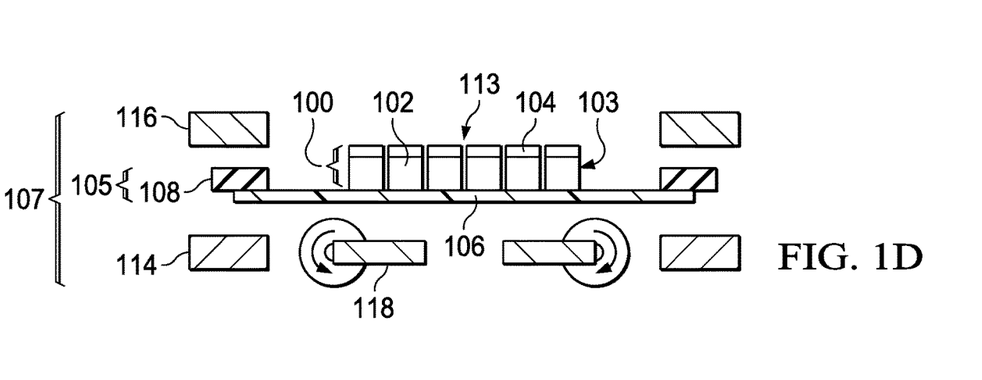

As illustrated in FIG. 1D, after the cuts 113 are made, the wafer dicing assembly 105 is loaded into a dicing tool 107 which consists of first clamps 114 and second clamps 116 for securing the wafer dicing assembly 105 in place. The non-sticky side of the dicing tape 106 faces the dicing tape stretching table 118. The wafer 100 is mounted on the opposing sticky side of the dicing tape 106. When the dicing tool is operated, dicing tape stretching table 118 stretches the dicing tape 106.

Figure 1E:
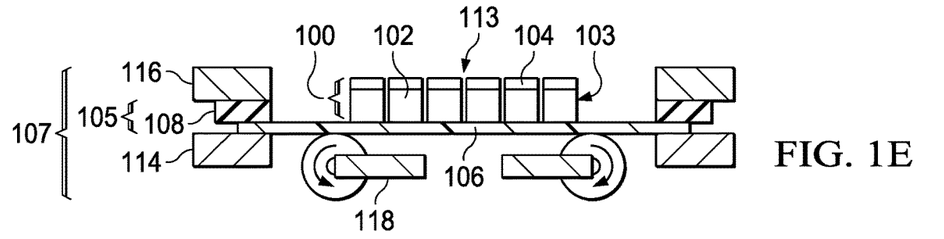

As illustrated in FIG. 1E, the first clamp 114 and the second clamp 116 hold the flexible dicing frame 108 portion of the wafer dicing assembly 105 securely in place over the tape stretching table 118. The non-sticky side of the dicing tape 106 faces the tape stretching table 118. Note that the dicing tape 106 is stretched in all directions, even though the cross sectional views of FIG. 1D-1G show only a portion of the dicing tape and wafer that are visible in cross section, but the tape stretching tool 118 applies force in a circumference around the semiconductor wafer 100 and stretches the dicing tape 106 in all directions, causing the dies 103 to separate along the scribe lanes on all four sides of each die 103, forming rectangular dies as the dies 103 separate from one another.

Figure 1F:
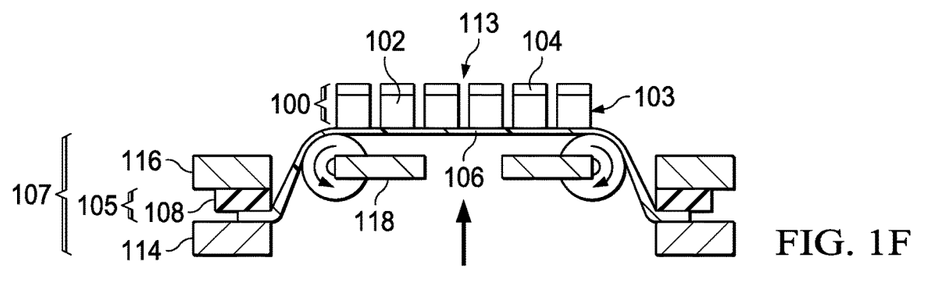

As illustrated in FIG. 1F, the tape stretching table 118 is raised against the dicing tape 106 causing it to stretch. The force applied by the tape 106 as it stretches causes openings in the cuts 113 to open completely through the semiconductor substrate 102 along the scribe lanes 112. As the dicing tape 106 is additionally stretched, the semiconductor dies 103 are separated one from another as gaps further open between the semiconductor dies 103 along the scribe lanes, to singulate the dies 103.

Figure 1G:
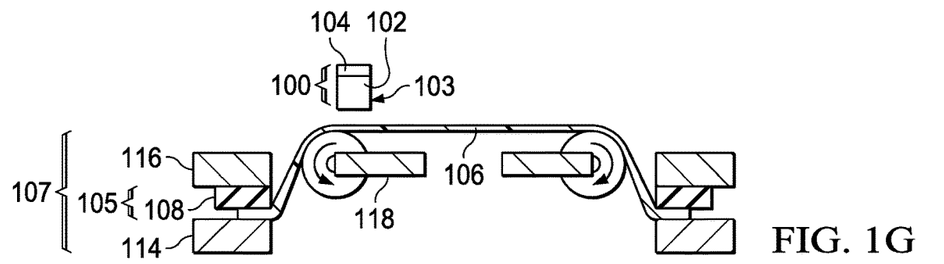

As illustrated in FIG. 1G, the singulated semiconductor dies 103 are then removed from the dicing tape 106. This can be done using pick and place equipment, for example. Each semiconductor die 103 has semiconductor devices 104 formed on the active surface.

Figure 2:
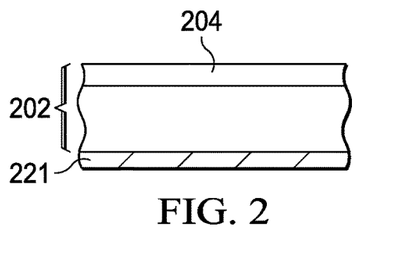
FIG. 2 is a cross section illustrating a semiconductor substrate with a metal layer over a backside surface.
Figure 3:
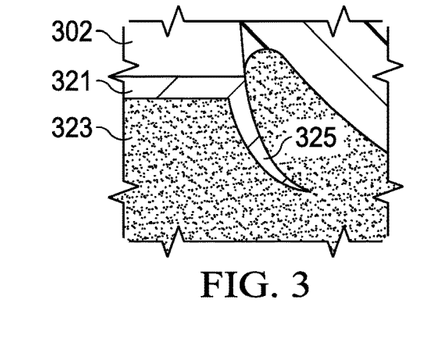
FIG. 3 is a cross section illustrating a portion of a semiconductor die with a metal layer over a backside surface and showing a metal burr extending from the semiconductor die.

FIGS. 2 and 3 are cross-sectional views that illustrate an arrangement and show some issues that can arise in singulating semiconductor dies, particularly when the semiconductor dies have a thick layer of backside metal on the surface of the semiconductor substrate that is opposite the active surface. Backside metal is added to the semiconductor wafer after the semiconductor devices are completed in a "back-end" process to improve thermal transfer, such as for power transistor devices. The backside metal can be one of several metals, such as silver and silver alloys or compounds; gold, gold alloys and gold compounds; nickel, nickel alloys and nickel compounds; palladium, palladium alloys and compounds, and other metals with high thermal conductivity. The backside metal is softer than the crystalline semiconductor substrate. In an example the backside metal is silver or a silver compound plated to a thickness of about 2 μms or more on a semiconductor wafer. In a particular example arrangement, the backside metal layer is composed of Ti (0.2 μms)+Ni (0.2 μms)+Ag (3 μms) thickness. Silver is the last or outermost layer in this example.

In FIG. 2 similar reference labels are used for similar elements as are shown in FIG. 1A, for clarity. For example, substrate 202 in FIG. corresponds to substrate 102 in FIG. 1A. In FIG. 2, the substrate 202 has a layer of thick metal layer 221 on a backside surface while semiconductor devices 204 are formed on an active surface (opposite the backside surface.)

FIG. 3 illustrates a problem that can occur in singulating dies when semiconductor dies include a thick backside metal layer. In FIG. 3 similar reference labels are used for similar elements as are shown in FIG. 1A, for clarity. For example, substrate 302 in FIG. 3 corresponds to substrate 102 in FIG. 1A. In FIG. 3, the substrate 302 has a metal layer 321 on the backside. After cutting and dicing, as described above, a metal burr forms that is shown in area 325. The metal burr 325 is caused during the mechanical sawing operation. The soft metal of the backside metal layer is not cut by the rotating saw blade after it cuts through the wafer and extends into the thick backside metal layer, instead the metal is partially cut and partially dislocated away from the blade and a burr forms that extends from the wafer in the scribe lane area, here burr 325. A problem caused by the burr 325 includes electrical shorts that can occur when the die attach material 323 is a non-conductive die attach, but the metal burr 325 can extend through the die attach and electrically contact a conductive lead frame (not shown). The burr forms an unintended electrical path to the die from the lead frame or substrate, that is, an electrical short.

In example arrangements, it has been surprisingly discovered that forming a high modulus layer on the backside metallization of the wafer including the semiconductor dies prior to wafer sawing can prevent the metal burrs that can occur without the use of the arrangements. In some examples, a conductive die attach film is used for the high modulus layer, the conductive die attach is used in the arrangements even in examples where electrical isolation is desired in the finished device between the backside of the semiconductor dies and the substrate. After the semiconductor dies are singulated from the wafer by performing mechanical sawing, a non-conductive die attach can be used to mount the integrated circuits having the backside metallization and the high modulus layer to a substrate or lead frame. The non-conductive die attach provides electrical isolation between the substrate and the die even though an electrically conductive die attach film is used as the high modulus layer, while still providing a thermally conductive path. The thermally conductive path extends from the substrate through the non-conductive die attach, and through the conductive die attach film, to the backside metallization of the semiconductor die. Thus, in certain arrangements a thermally conductive path is formed between the integrated circuit die and the substrate, even while the electrical isolation is maintained between the integrated circuit die and the substrate. In other arrangements a conductive die attach can be used to mount the semiconductor dies to the substrate when an electrical coupling and a thermally conductive path is to be formed between the substrate and the backside metallization.

FIGS. 4A-4D illustrate in cross sectional views a method for forming an arrangement used for singulating semiconductor dies with thick backside metal layers. In FIGS. 4A-4D similar reference labels are used for similar elements as are shown in FIG. 1A. For example, substrate 402 in FIGS. 4A-4D corresponds to substrate 102 in FIG. 1A.

Figure 4A:
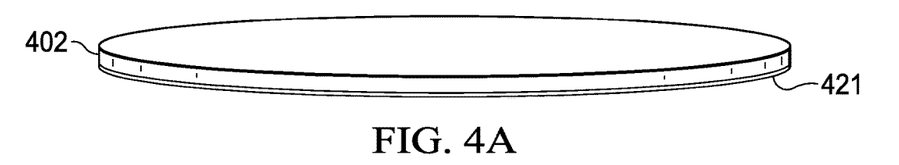
FIGS. 4A-4D are cross sectional views of the major steps for forming an arrangement including a layer with a modulus greater than about 4000 MPa over a metal layer on a backside surface of a semiconductor wafer.

FIG. 4A shows a semiconductor substrate 402 with a thick backside metal layer 421 formed on the backside surface of the wafer. The metal backside layer 421 can be formed by plasma sputter deposition, or by first forming a seed layer followed by electroless or electroplating a thick metal layer. The thick backside layer 421 can be one or more of silver, gold, nickel, palladium, platinum, tin, and compounds and alloys thereof, and including multiple layers of different metals. Multiple depositions of the same material can be performed to achieve a desired metal thickness. In an example a layer of silver is sputter deposited on the backside of the wafer. Silver has excellent thermal conductivity and a thick backside metal layer of silver is useful in increasing performance of power devices such as power FET transistors by efficiently transferring thermal energy away from the semiconductor die during device operations.

Figure 4B:
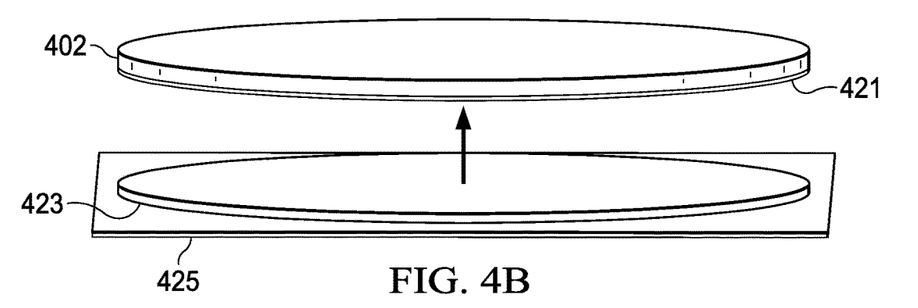
Figure 4C:
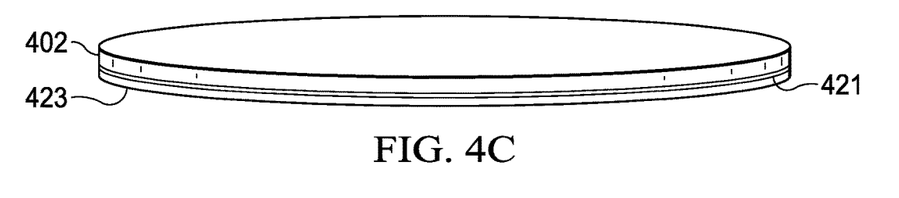

In FIG. 4B, a layer of a high modulus film material 423 can be laminated to the thick backside metal layer 421. In an example, a conductive die attach film commercially available from Henkel Corporation, designated CDF 215, is used. Additional conductive die attach films useful in the arrangements are available from Henkel Corporation. The conductive die attach film in the example has a modulus greater than about 5400 MegaPascals (MPa) and is approximately 15 μms thick. The film 423 is applied on a backing tape 425. After the film 423 is adhered to the metal backside layer 421, as shown in FIG. 4C, the backing tape 425 is peeled away. In alternative arrangements a high modulus layer having a modulus greater than about 4000 MPa and up to about 8000 MPa measured at 25 degrees Celsius can be used.

Figure 4D:
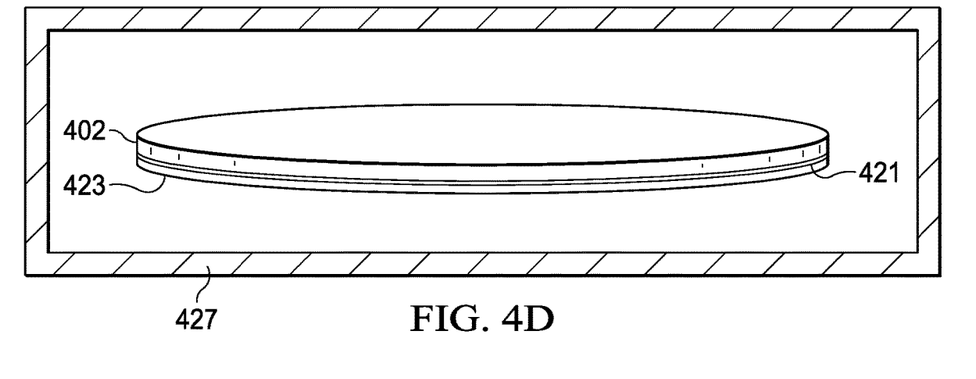

FIG. 4D is a block diagram showing an oven 427 that is used to cure the high modulus layer 423, in this example, the conductive die attach film 423 with a modulus of 5400 MPa. In this example, the film is thermally cured using a 120 degrees Celsius temperature for about 120 minutes. Shorter or longer times can be used, and lower and higher temperatures can be used, to cure the high modulus film 423. The curing process hardens and stiffens the high modulus layer 423.

Figure 5A:
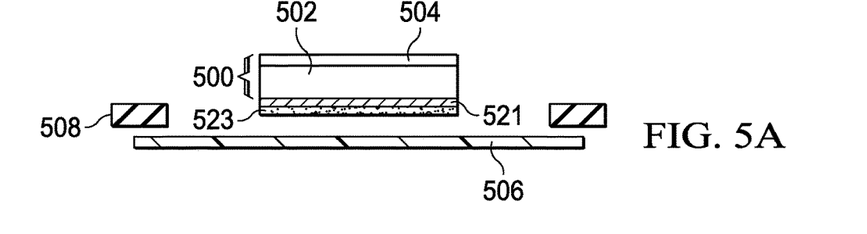
FIGS. 5A-5F are cross sectional views of the major steps for singulating semiconductor dies with a metal backside layer and the layer with a modulus greater than about 4000 MPa of an arrangement from one another.
Figure 5B:
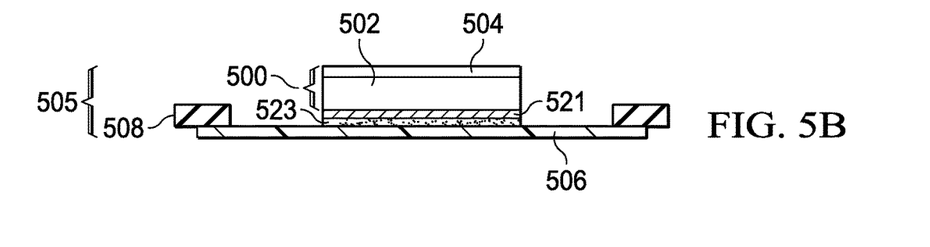
Figure 5C:
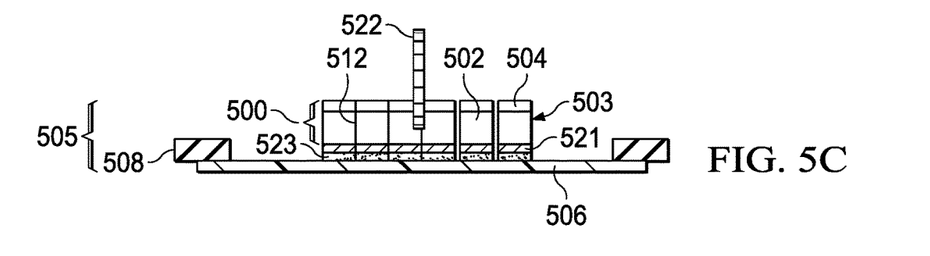
Figure 5D:
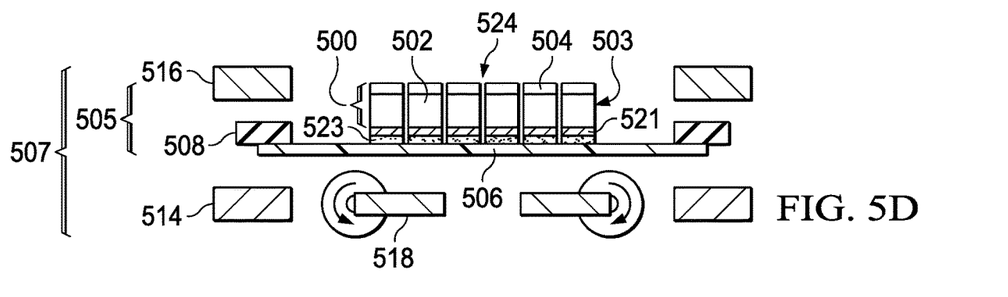

FIGS. 5A-5F illustrate in a series of cross sectional views the sawing and dicing singulation processes of an arrangement such as the one shown in FIGS. 4A-4D. Note that in FIGS. 5A-5F similar reference numerals are used for similar elements as in FIGS. 4A-4D, for example substrate 502 corresponds to substrate 402. In FIG. 5A a substrate 502 with devices 504 formed on an active surface has a thick backside metal layer 521 and a high modulus film 523 formed on a backside surface. The high modulus film 523 has been cured to harden and stiffen the high modulus film. The substrate is positioned adjacent a dicing tape 506 and a frame 508. As shown in FIG. 5B, the substrate 502 with the backside metal layer 521 and the high modulus layer 523 are used in a sawing assembly 505 consisting of semiconductor wafer 500 mounted on the sticky side of dicing tape 506. In this example, the sticky side of the dicing tape 506 is adhered to a dicing tape support ring 508. As shown in FIG. 5C A dicing saw 522 can be used in a wafer sawing tool to cut through the semiconductor wafer 500 along the scribe lanes 512. In an example arrangement the saw 522 may have two blades, one that cuts through the semiconductor wafer and through the thick metal layer 521 and into the dicing tape, and a second blade that cuts through the semiconductor substrate 502. The cuts 524 extend through the semiconductor wafer 500 as shown in FIG. 5D. In additional examples the cut can extend from about 70% and up to 100% of the thickness of wafer 500 and can extend through the backside metal layer 521 and high modulus film 523.

In FIG. 5D the wafer dicing assembly 505 is shown clamped between a first clamp 514 and a second clamp 516 in a dicing tool 507. The clamps 514, 516 are used to position the mounted wafer assembly 505 over the dicing tape stretching table 518.

Figure 5E:
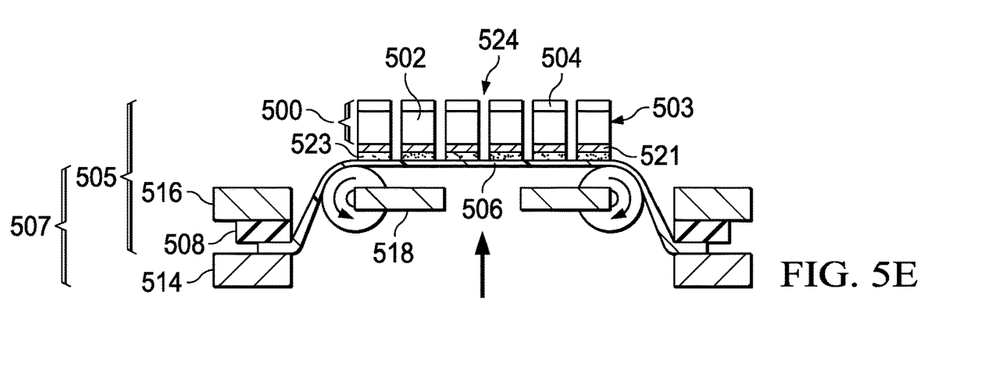
Figure 5F:
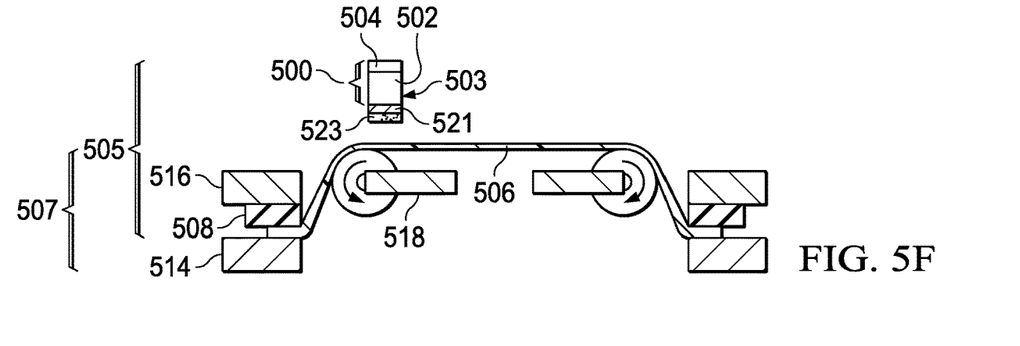

FIG. 5E illustrates the dicing tape stretching table 518 in operation. In FIG. 5E, clamps 514 and 516 are closed and the dicing tape stretching table 518 is then raised against the non-sticky surface of the dicing tape 506 in the wafer dicing assembly 505 and pushes against the dicing tape 506, causing it to stretch. As the dicing tape 506 is stretched, the force applied by the stretching dicing tape 506 causes the cuts 524 to further open and separate the semiconductor dies 503 from one another. As the dicing tape 506 is additionally stretched, the semiconductor dies 503 are separated from one another as gaps widen between the semiconductor dies 503. Then, the singulated semiconductor dies 503 are removed from the dicing tape 506 as shown in FIG. 5F. As described hereinabove, although the cross sectional views show the dicing tape stretching table 518 contacting the dicing tape 506 at two positions that are visible in the cross sectional view of FIGS. 5D-5E, in the dicing tool the dicing tape stretching tool 518 contacts the dicing tape 506 in a circular pattern around the semiconductor substrate 502, and as the force is applied, the tape 506 is stretched in all directions. The cuts 524 in the scribe lanes 512 on each side of the semiconductor dies 503 are opened through the substrate and form wider openings due to the force applied to stretch the dicing tape 506, and the force applied by the stretched dicing tape 506 pulls the semiconductor dies 503 apart to form rectangular dies.

Figure 6:
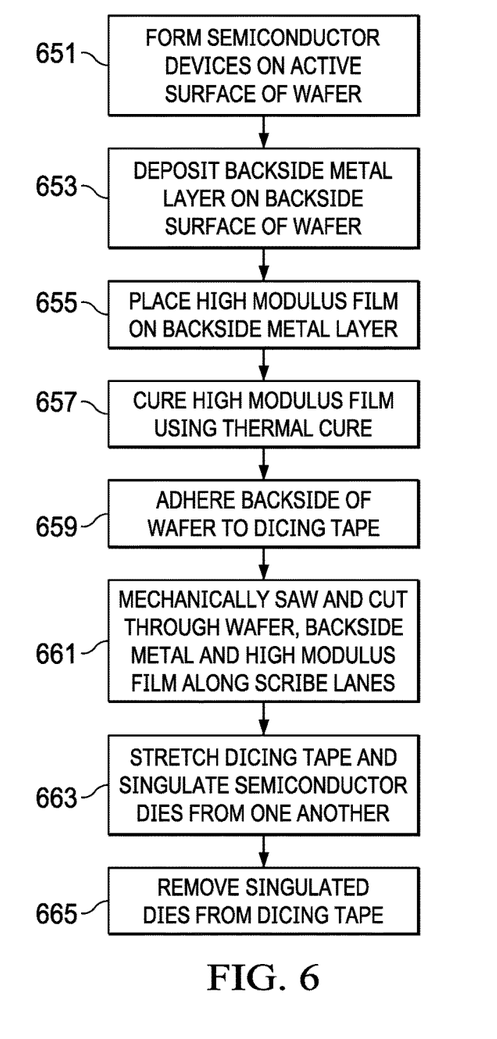
FIG. 6 is a flow diagram illustrating a method such as the method of FIGS. 4A-4D and 5A-5F.

FIG. 6 illustrates in a series of steps a method for using the arrangements described above to form semiconductor dies with a thick backside metal layer as shown in the cross sections of FIGS. 4A-4D and 5A-5F described above.

At step 651, the method of FIG. 6 begins by forming semiconductor devices on an active surface of a semiconductor wafer. At step 653, a thick metal layer is deposited on the backside of the wafer (see, for example, FIG. 4A).

At step 655, the layer of high modulus film is attached to the thick metal layer on the backside of the semiconductor wafer. In the example shown above the high modulus film is a conducive die attach film provided as adhesive material on a backing tape. In alternative arrangements, high modulus material can be deposited on the thick metal backside layer using, for example, ink jet deposition, including multiple passes over the backside of the semiconductor wafer to ink jet deposit multiple layers of material, stencils, or screen printing processes to deposit the high modulus material. (See FIGS. 4B-4C.)

At step 657, the high modulus film is cured to harden the film. In the example described above, the film is subjected to a thermal cure of 120 minutes at about 120 degrees Celsius. (See FIG. 4D.) If a UV cure high modulus film is used, the thermal cure is replaced with a UV cure.

At step 659 in FIG. 6, the backside of the wafer including the high modulus film and the thick backside metal layer are adhered to a dicing tape. (See FIGS. 5A-5B.) At step 661, the wafers on the dicing tape are placed in a wafer saw tool and a mechanical sawing operation is performed to cut through the wafer and the thick metal layer and the high modulus film, cutting along scribe lanes. (See FIG. 5D.)

At step 663 the wafer and dicing tape are placed into a wafer dicing tool. The dicing tape is stretched in the dicing tool to open the cuts made into the wafer. (See FIG. 5E.)

At step 665, the separated singulated semiconductor dies are removed from the dicing tape. (See FIG. 5F.) This can be done, for example, by a pick and place tool.

Figure 7:
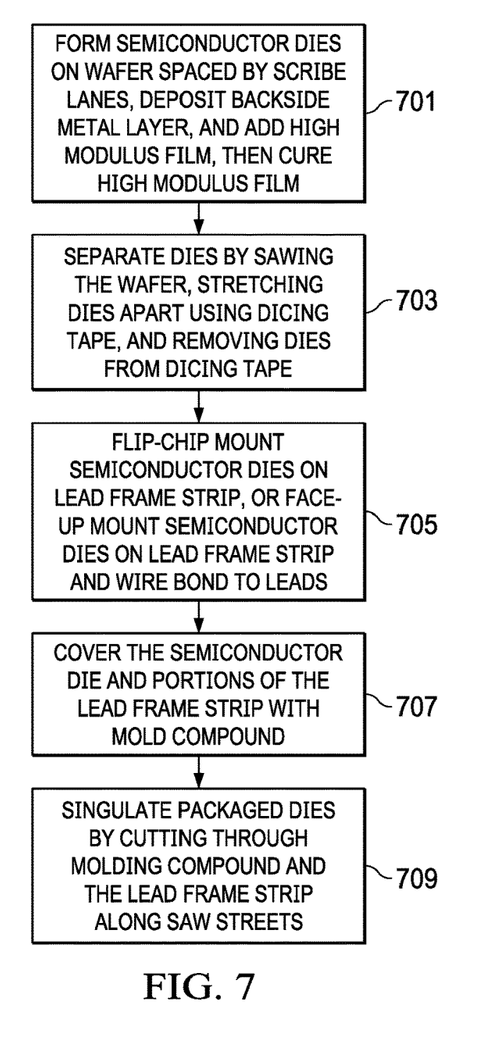
FIG. 7 is a flow diagram illustrating a method of forming a packaged semiconductor device for use with the method of FIG. 6.

In FIG. 7, a series of steps illustrate a method to use the semiconductor dies of the arrangements to form packaged semiconductor devices. These steps can include the steps shown in FIG. 6, for example.

In step 701, semiconductor dies are formed on a semiconductor wafer spaced from one another by scribe lanes, the wafer has a thick backside metal layer deposited on the backside, and a high modulus film layer is deposited over the backside metal layer as described hereinabove. The high modulus film layer is cured.

In step 703, the semiconductor dies are separated from one another using mechanical sawing as described above, and using the dicing tape stretched at to separate the dies along the scribe lanes as described above. The dies are then singulated and pick and place operations remove the semiconductor dies from the dicing tapes as described above.

At step 705, the semiconductor dies are mounted on a die mount portion of a package substrate. In one example the package substrate can be conductive metal lead frames in a lead frame strip. A lead frame strip can include several lead frames, each lead frame having conductive leads and a die mount area supported by additional removable portions of the lead frame strip. Materials for lead frames include copper and alloys of copper, copper plated nickel or other base material, Alloy 42, stainless steel, and other conductive materials. Bondable or solderable coatings such as nickel, palladium, tin, solder, and combinations of these, or other coatings can be formed over the substrate to aid in making solder or wire bond connections to the leads of the substrate. Other package substrates that can be used include molded interconnect substrates (MIS) with conductors formed in a matrix with dielectric material such as mold compound or epoxy, or a partially etched or "half-etched" metal substrate. Premolded lead frame (PMLF) substrates can be used. The semiconductor dies are placed on die mount areas of the package substrate. In an example process several die mount areas are provided in an array or matrix for forming several packages simultaneously, using a package substrate that is provided as an array or strip. In a flip-chip method, the semiconductor die is placed with the active circuitry facing conductive lands on the package substrate. Solder bumps or pillar bumps on bond pads of the semiconductor die are placed in contact with portions of the leads in the package substrate, and solder reflow is performed to electrically connect and mechanically bond the solder bumps or pillar bumps to the leads. In a wire bond method, the semiconductor die is placed with the active circuitry facing away from the package substrate strip. The semiconductor die can be mounted using non-conductive die attach material. Bond wires are attached to bond pads of the semiconductor dies and to lead portions of the leads of the substrate to electrically connect the semiconductor dies to the leads. If the package substrate is a lead frame, removable portions of the lead frame keep the leads in place during packaging, these removable portions are then trimmed away after the die is mounted, bonded and covered with a dielectric material such as mold compound. In an arrangement using wire bonding and mounting the semiconductor die to a lead frame, a non-conductive die attach material is used to mount the integrated circuit die to a die mount portion of the conductive lead frame. The non-conductive die attach material provides electrical isolation between the integrated circuit die and the lead frame while also providing a thermally conductive path between the lead frame die mount portion and the integrated circuit die as is described hereinabove.

At step 707, a mold compound is applied over the semiconductor dies. The mold compound covers the semiconductor die and at least portions of the package substrate strip. Portions of the conductive leads are not covered with mold compound so that these portions can later be used to make electrical connections to the packaged semiconductor devices. In an encapsulation molding process a liquid mold compound can be applied over the semiconductor die and portions of the package substrate, and then cured to form a package body. A thermoset plastic resin can be provided as a solid, heated to a liquid state, pressed into a transfer or block mold containing the package substrate strip, and then cured to form a solid package. Room temperature liquid material, such as resins, epoxies and polymers, can be applied and cured simply using time or by applying UV or thermal energy to become cured and form a solid package body.

At step 709, the packaged semiconductor dies and lead frames are singulated from one another by cutting between the lead frames in saw streets in the package substrate strip. If the mold compound also covers the saw street areas (for example in a "block molding" process), the mold compound is also cut through to singulate the packaged semiconductor devices from one another.

Figure 8:
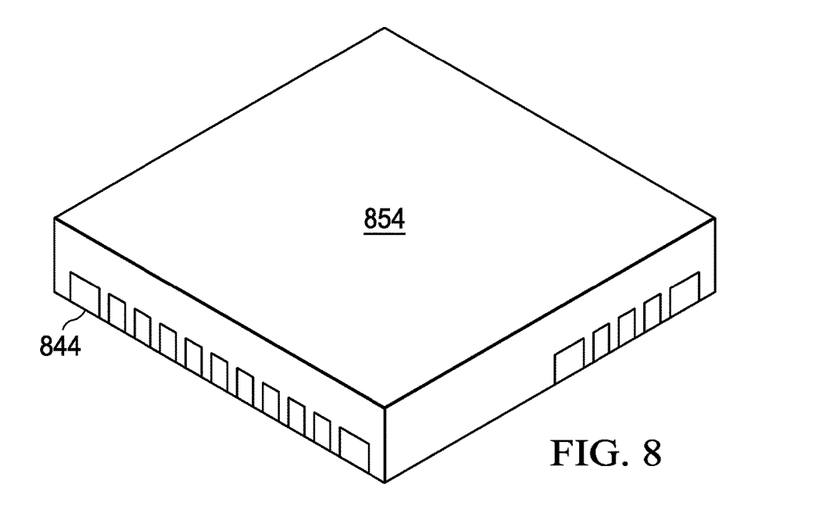
FIG. 8 is a projection view of a packaged semiconductor device.

FIG. 8 is a projection view of a quad flat no leads (QFN) packaged semiconductor device 854 that includes the thick metal backside layer and high modulus layer on a semiconductor die as described above. In FIG. 8, the packaged semiconductor device is formed by the mold compound with portions of leads 844 exposed from the mold compound to form electrical terminals for the packaged semiconductor device 854. Other packages can be used with the arrangements including ball grid array (BGA) packages, small outline packages with leads or small outline no lead (SON) packages, and other leaded and no lead semiconductor packages can be used with the arrangements. The semiconductor die can be flipped over face down in a "flip chip" package or can be wire bonded to a lead frame "face up" in a wire bonded package.

Figure 9:
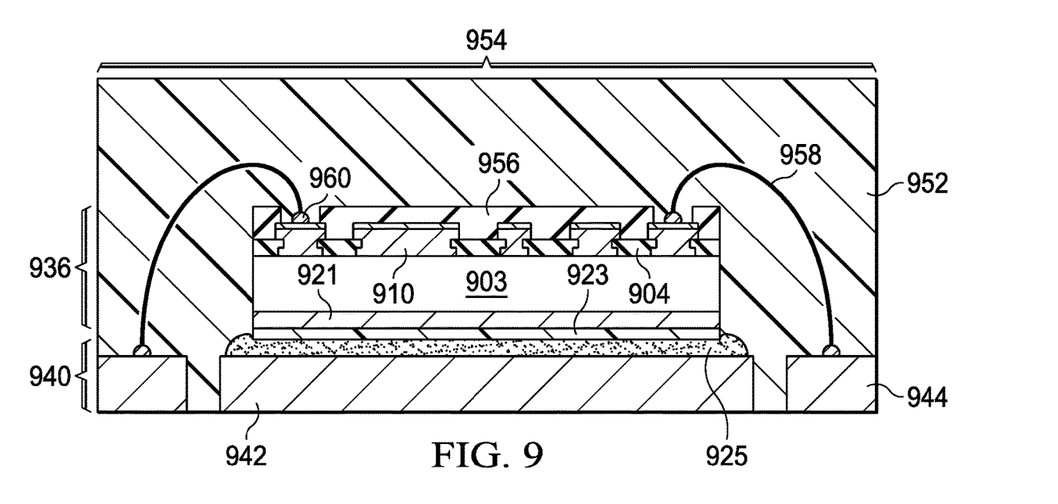
FIG. 9 is a cross sectional view of a packaged semiconductor device.

FIG. 9 is a cross sectional view of an example packaged semiconductor QFN device 954 that is similar to the semiconductor device 854 in FIG. 8. The packaged semiconductor device can be formed by the process steps of FIG. 7 as described above. In FIG. 9 a wire bonded semiconductor die 903 is shown packaged in a quad flat no-leads (QFN) package. Semiconductor die 903 is mounted on a die mount area 942 of a lead frame or other package substrate 940. Conductive leads 944 of package substrate 940 are coupled to the bond pads 960 on the semiconductor die 902 by bond wires 958. A protective overcoat layer 956 covers the conductors 910 on the active device side of the semiconductor die 902, and openings in the protective overcoat layer 956 expose the bond pads 960 for bonding. A dielectric layer 904 is shown on the active surface of semiconductor substrate 902, in a practical example layer 904 may have several layers and conductors 910 may also have several layers that are electrically insulated from one another by additional dielectric layers such as 904, and with vias extending between the conductor layers and extending through the dielectric layers that provide electrical connections between the conductor layers. Mold compound 952 covers the semiconductor die 902, the bond wires 958, and portions of substrate 940, while portions of leads 944 remain uncovered with mold compound. The uncovered portions of leads 944 enable electrical connection to the packaged semiconductor device 954.

The semiconductor die 903 includes a thick metal backside layer 921 and a high modulus layer 923 as described above. A non-conductive die attach epoxy 925 is shown between the backside of the die 903 and a die mount pad 942 on the leadframe 940. The non-conductive die attach 925 is thermally conductive while being electrically insulating, providing high thermal transfer from the semiconductor die to the substrate 940 while electrically isolating the die from the package substrate. In an alternative arrangement, a conductive die attach can be used to mount the die to the substrate to electrically couple the backside of the semiconductor die to the substrate.

Modifications and variations are contemplated and can be made in the described arrangements, and other alternative arrangements are possible that are within the scope of the claims.

What is claimed is:

1. A method for making a semiconductor device, comprising:
    forming a metal layer on a surface of a semiconductor wafer, the semiconductor wafer having semiconductor dies spaced apart by scribe lanes, the surface being a backside surface of the semiconductor wafer opposite an active surface;
    forming a layer with a modulus of up to 8000 MPa over the metal layer on the surface of the semiconductor wafer;
    mounting the surface of the semiconductor wafer including the metal layer and the layer on a first side of a dicing tape;
    sawing between the semiconductor dies along the scribe lanes by using a saw blade to cut through the semiconductor wafer, the metal layer, and the layer;
    separating the semiconductor dies one from another;
    positioning the semiconductor dies on a substrate such that the metal layer and the layer are in between the semiconductor dies and the substrate;
    coupling leads of the substrate to bond pads on the semiconductor dies;
    covering the semiconductor dies and at least a portion of the leads with mold compound; and
    cutting the substrate and the mold compound along saw streets between the semiconductor dies on the substrate, forming separate packaged semiconductor devices, each including at least one semiconductor die.

2. The method of claim 1, wherein the packaged semiconductor device forms one of a quad flat no lead (QFN) packaged device, and a small outline no lead (SON) packaged device.

3. The method of claim 1, wherein the modulus of the layer is greater than about 4000 MPa.

4. The method of claim 1, wherein the metal layer comprises silver.

5. The method of claim 1, wherein the metal layer comprises one selected from a group consisting essentially of silver, gold, palladium, nickel, tin, platinum, and alloys thereof.

6. The method of claim 1, wherein:
    forming the layer comprises laminating a conductive die attach film to the metal layer on the surface of the semiconductor wafer; and
    separating the semiconductor dies one from another includes separating by stretching the dicing tape.

7. The method of claim 6, wherein forming the layer comprises curing the layer prior to the sawing.

8. The method of claim 7, wherein curing the layer further comprises placing the semiconductor wafer including the layer on the surface in an oven and exposing the semiconductor wafer to a temperature above 100 degrees Celsius for a time over 100 minutes.

9. The method of claim 1, wherein forming the layer further comprises performing one of: ink jet deposition; stencil printing; and screen printing.

10. The method of claim 1, wherein the metal layer is at least 2 μms thick.

11. A device, comprising:
    a semiconductor die mounted to a die mount portion of a package substrate, the semiconductor die having devices formed on a device side, and having an non-device side opposing the device side;

a metal layer formed on and in physical contact with the non-device side;

a layer with a modulus greater than 4000 MPa up to 8000 Mpa formed over the metal layer;

bond wires coupled between bond pads on the device side of the semiconductor die and conductive lead portions of the package substrate; and mold compound covering the semiconductor die, at least a portion of the package substrate, and the bond wires, and a portion of the conductive leads, a remaining portion of the conductive leads extending from the mold compound.

12. The device of claim 11, wherein the layer with a modulus greater than about 4000 MPa up to about 8000 MPa comprises a conductive die attach film.

13. The device of claim 12, wherein the layer with a modulus greater than about 4000 MPa up to about 8000 MPa has a modulus greater than 5000 MPa.

14. The device of claim 11, wherein the metal layer comprises one selected from a group consisting essentially of silver and silver alloys.

15. The device of claim 11, wherein the metal layer comprises one selected from a group consisting essentially of: silver, gold, nickel, tin, palladium, platinum and alloys thereof.

16. The device of claim 11, wherein the metal layer further comprises titanium, nickel, and silver layers.

17. The device of claim 11, and further comprising a non-conductive die attach between the layer with a modulus greater than about 4000 MPa up to about 8000 MPa and the die mount portion of the substrate.

18. The device of claim 11, wherein the device forms a quad flat no-lead package.

19. A method for making a semiconductor device, comprising:

forming a metal layer on a first surface of a semiconductor wafer, the semiconductor wafer having semiconductor dies spaced apart by scribe lanes on a second surface of the semiconductor wafer opposite the first surface, the first surface being a backside of the semiconductor wafer and the second surface being an active surface of the semiconductor wafer;

forming a layer with a modulus greater than 4000 MPa up to 8000 MPa over the metal layer;

mounting the second surface of the semiconductor wafer including the metal layer and the layer on a first side of a dicing tape;

cutting through the semiconductor wafer, the metal layer, and the layer along scribe lanes;

separating the semiconductor dies from the semiconductor wafer and from one another by stretching the dicing tape, expanding the cuts in the semiconductor wafer along the scribe lanes between the semiconductor dies; and removing the separated semiconductor dies from the dicing tape.

20. The method of claim 19, and further comprising curing the layer with a modulus greater than about 4000 MPa up to about 8000 MPa prior to mounting the semiconductor wafer to the dicing tape.

* * * * *